(12) United States Patent
Dornstetter

(10) Patent No.: US 11,177,906 B2
(45) Date of Patent: Nov. 16, 2021

(54) CODER AND DECODER USING A QUASI-CYCLIC SEMI-REGULAR LDPC CODE OF SHORT LENGTH FOR LOW CONSUMPTION APPLICATIONS SUCH AS REMOTE READING

(71) Applicants: SUEZ GROUPE, Paris la Défense (FR); GRDF, Paris (FR)

(72) Inventor: Jean-Louis Dornstetter, Choisel (FR)

(73) Assignees: SUEZ GROUPE, Paris la Defense (FR); GRDF, Paris (FR)

( * ) Notice: Subject to any disclaimer, the term of this patent is extended or adjusted under 35 U.S.C. 154(b) by 135 days.

(21) Appl. No.: 16/348,482

(22) PCT Filed: Nov. 17, 2017

(86) PCT No.: PCT/EP2017/079621
§ 371 (c)(1),
(2) Date: May 8, 2019

(87) PCT Pub. No.: WO2018/095817
PCT Pub. Date: May 31, 2018

(65) Prior Publication Data
US 2020/0067636 A1  Feb. 27, 2020

(30) Foreign Application Priority Data

Nov. 23, 2016  (EP) ..................... 16306546

(51) Int. Cl.
*H03M 13/11* (2006.01)
*H04L 1/00* (2006.01)
(Continued)

(52) U.S. Cl.
CPC ....... *H04L 1/0057* (2013.01); *H03M 13/1105* (2013.01); *H03M 13/611* (2013.01);
(Continued)

(58) Field of Classification Search
CPC ................. H04L 1/0057; H04L 1/0063; H03M 13/1105; H03M 13/611; H03M 13/1177;
(Continued)

(56) References Cited

U.S. PATENT DOCUMENTS 8,650,451 B2 * 2/2014 Krishnan .......... H03M 13/1117
714/752
9,172,400 B2 * 10/2015 Jin .................... H04L 1/0058
(Continued)

OTHER PUBLICATIONS

Divsalar, et al., "Short Protograph-Based LDPC Codes", MILCOM 2007—IEEE Military Communications Conference, pp. 1-6, Oct. 29, 2007.

*Primary Examiner* — Albert Decady
*Assistant Examiner* — Enam Ahmed
(74) *Attorney, Agent, or Firm* — BakerHostetler

(57) ABSTRACT

An LDPC (Low-Density Parity Check) code based on a control matrix represented by a Tanner bipartite graph includes 128 variable nodes of the graph and 64 constraint nodes of the graph, the code being wherein each of the constraint nodes of the graph is connected to 7 variable nodes of the graph; each of the cycles of the graph has a length greater than or equal to 6; the minimum distance of the code is equal to or greater than a predefined threshold for minimum distance.

14 Claims, 8 Drawing Sheets

(51) Int. Cl.
*H03M 13/00* (2006.01)
*H04Q 9/00* (2006.01)

(52) U.S. Cl.
CPC ............ *H04L 1/0063* (2013.01); *H04Q 9/00* (2013.01); *H04Q 2209/40* (2013.01); *H04Q 2209/50* (2013.01); *H04Q 2209/60* (2013.01)

(58) Field of Classification Search
CPC ............ H03M 13/116; H03M 13/036; H03M 13/118; H03M 13/6502; H03M 13/6522; H04Q 9/00; H04Q 2209/40; H04Q 2209/50; H04Q 2209/60
USPC ........................................................ 714/758
See application file for complete search history.

(56) References Cited

U.S. PATENT DOCUMENTS

| | | | |
|---|---|---|---|
| 9,203,440 B1* | 12/2015 | Tunali ............... | H03M 13/2906 |
| 2006/0085720 A1* | 4/2006 | Tran ................... | H03M 13/1117 |
| | | | 714/758 |
| 2007/0245217 A1* | 10/2007 | Valle ................. | H03M 13/1125 |
| | | | 714/758 |
| 2013/0139024 A1* | 5/2013 | Nguyen ............. | H03M 13/033 |
| | | | 714/752 |
| 2016/0218750 A1* | 7/2016 | Ma .................... | H03M 13/1102 |

\* cited by examiner

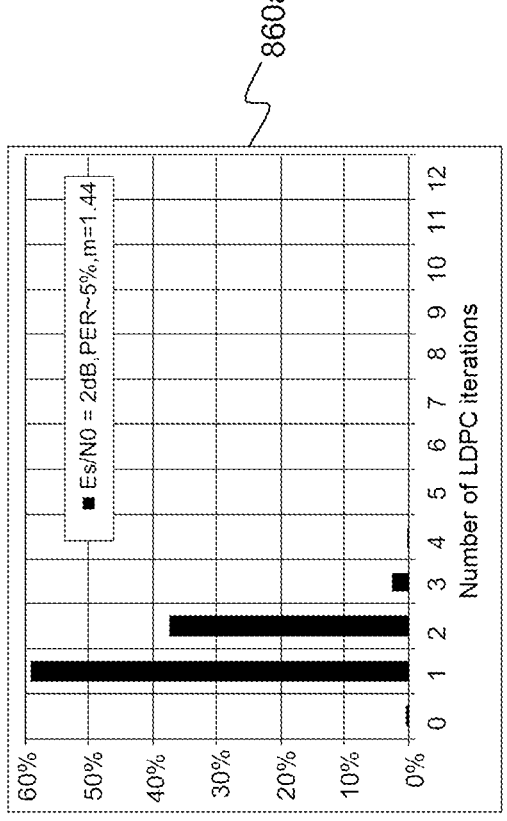
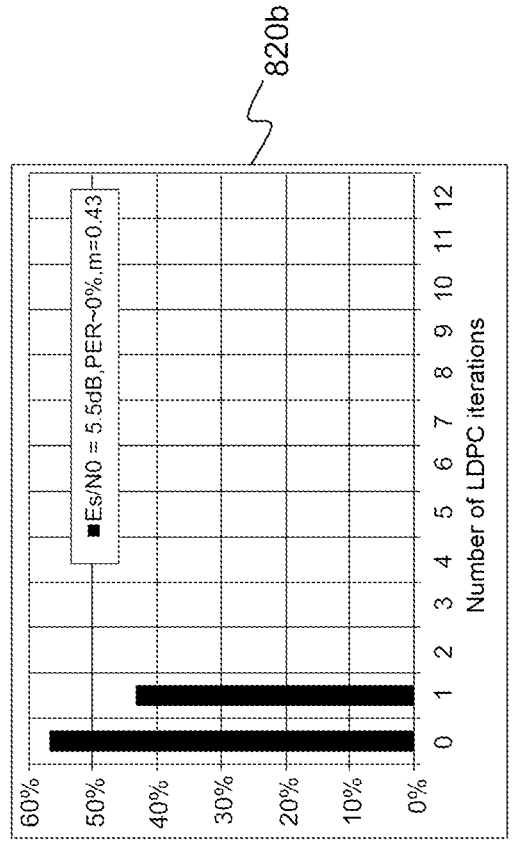
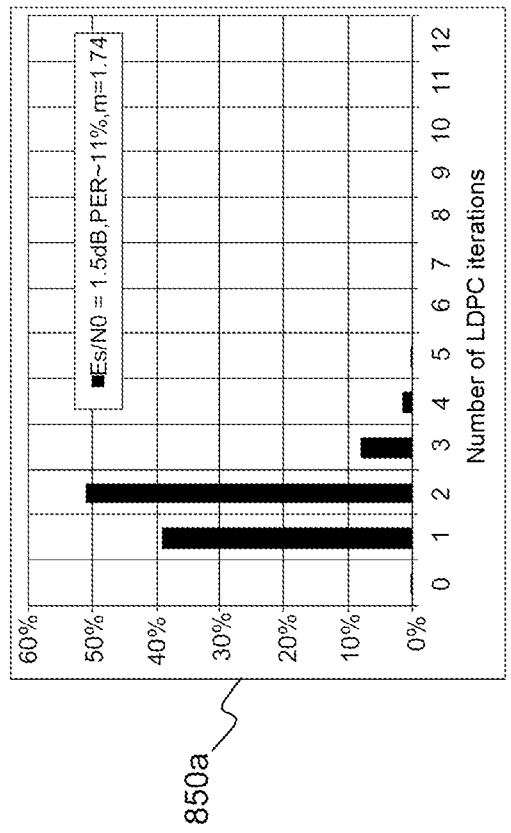
FIG. 8a-2
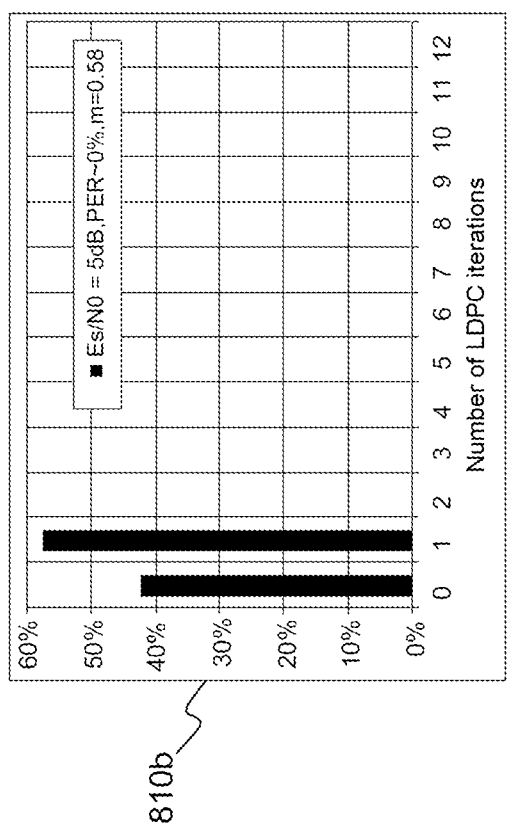
FIG. 8b

CODER AND DECODER USING A QUASI-CYCLIC SEMI-REGULAR LDPC CODE OF SHORT LENGTH FOR LOW CONSUMPTION APPLICATIONS SUCH AS REMOTE READING

CROSS-REFERENCE TO RELATED APPLICATIONS

This application is a National Stage of International patent application PCT/EP2017/079621, filed on Nov. 17, 2017, which claims priority to foreign European patent application No. EP 16306546.9, filed on Nov. 23, 2016, the disclosures of which are incorporated by reference in their entirety.

FIELD OF THE INVENTION

The present invention relates to the field of error correction codes. It relates more specifically to LDPC codes allowing signals to be transmitted with a low energy consumption and a low decoding complexity, while at the same time conserving good error correction properties, for the transmission of data in the field of the Internet of Objects, for example over a network of the LPWAN (acronym for Low Power Wide Area Network) type, notably for the transmission of data from remote meter readings for water or power.

BACKGROUND

The transmission of data may be carried out via various communication channels, for example by radio communication, optical fiber, etc. In the vast majority of cases, the transmission channel is not totally reliable, and the transmission may be tainted with errors. Generally speaking, the lower the signal-to-noise ratio, or SNR, of the transmission channel, the noisier the channel and the higher the error rate.

By adding redundancy bits to the signal to be encoded, the error correction codes allow the transmission errors to be detected and corrected. Numerous error correction codes exist. Generally speaking, they are aimed at obtaining a maximum error detection and/or correction rate, while at the same time adding the fewest possible redundancy bits. Depending on the applications, it may also be important to limit the encoding and/or decoding complexity of the error correction code.

The codes referred to as LDPC (acronym for Low Density Parity check Code) are a family of error correction codes. LDPC codes are popular for the transmission of data over particularly noisy channels. They are notably used as error correction codes in the DVB-S2 standard.

LDPC codes are represented by a bipartite graph, known as a Tanner graph, formed of variable nodes and of constraint nodes. During the decoding, one or more iterations allow it to be successively verified whether the message is transmitted without errors, and, in the case of error(s), allow the latter to be corrected. Codes of the LDPC type are for example introduced by Davey, M. C., & MacKay, D. J. (1998, June). Low-density parity check codes over GF (q). In *Information Theory Workshop,* 1998 (pp. 70-71). IEEE.

Remote reading, for example of water meters or of energy meters of the gas or electricity type, consists in remotely collecting information coming from each meter, and in doing this periodically, for example daily consumptions. Remote reading offers numerous advantages with respect to a manual reading of the consumptions: the data are transmitted more regularly, and the remote reading allows values to be acquired coming from sensors difficult to access for an operator. Moreover, the automatic and remote sending of consumption values is a more cost-effective and quicker solution than the manual reading of meters. Generally speaking, in remote reading, meters send consumption data at regular intervals to hubs via a radio link, and the hubs transmit this data to a processing platform.

The remote reading of this type of meters presents particular difficulties: the meters are often in areas that are difficult to access, and are often powered by a battery. The meter is then designed to operate autonomously for a long period of time, for example of the order of 20 years, without intervention. In order to prolong the lifetime of the battery, this type of meter generally reduces the emission power so as to limit the power consumption due to the transmission of data. However, this results in the receiver acquiring a very noisy signal.

The LDPC codes of the prior art have the drawback of greatly increasing the energy consumed per useful bit transmitted. Moreover, the majority of the LDPC codes of the prior art are long codes. These long codes therefore require numerous iterations for decoding. This results in a high number of operations to be carried out for the decoding, and hence in a complex decoding. Moreover, the long codes may, when the size of the useful frames to be transmitted is small, lead to an increase in the size of the resulting block in order to be able to code the data.

There is accordingly a need for an error correction code allowing, at the encoding, the energy consumed per useful bit transmitted to be reduced, while at the same time conserving a limited decoding complexity, and a good rate of error corrections for very noisy signals.

SUMMARY OF THE INVENTION

For this purpose, the invention describes an LDPC (Low-Density Parity-Controlled) encoder configured for encoding signals using an LDPC code characterized in that it is based on a control matrix represented by a Tanner bipartite graph composed of 128 variable nodes of the graph and 64 constraint nodes of the graph, said graph being such that: each of the constraint nodes of the graph is connected to 7 variable nodes of the graph; each of the cycles of the graph has a length greater than or equal to 6; the minimum distance of said code is equal to or greater than 14; in which said Tanner bipartite graph is a graph derived from a protograph, said protograph comprising 8 variable nodes of the protograph, each variable node of the protograph being a group of 16 variable nodes of the graph and 4 constraint nodes of the protograph, each variable node of the protograph being a group of 16 constraint nodes of the graph, in which each constraint node of the protograph is connected to 7 of said variable nodes of the protograph according to a matrix, each constraint node of the protograph being represented by a row of the matrix, each variable node of the protograph being represented by a column of the matrix, each cell of the matrix, defined on a row and a column, comprising the value 1 when the variable node of the protograph represented by the row of the cell and the constraint node of the protograph represented by the column of the cell are connected, and the value 0 in the opposite case, said matrix being defined by the values:

$$\begin{pmatrix} 1 & 1 & 1 & 1 & 0 & 1 & 1 & 1 \\ 1 & 1 & 1 & 1 & 1 & 0 & 1 & 1 \\ 1 & 1 & 1 & 1 & 1 & 1 & 0 & 1 \\ 1 & 1 & 1 & 1 & 1 & 1 & 1 & 0 \end{pmatrix}$$

A variable node of the graph corresponds to one bit of encoded data, which may be a useful data bit or a redundancy bit.

A constraint node of the graph defines a constraint to be verified on the variable nodes to which it is connected.

One line on the graph represents a link between a constraint node of the graph and a variable node of the graph.

A cycle is a series of links originating and ending on the same node.

The length of a cycle is the number of links in the series of links forming the cycle.

An LDPC code according to the invention is a code said to be short, in other words having a low number of variable nodes compared with the codes usually used. This allows it to be decoded with a limited number of iterations, the complexity of the decoding of an LDPC code according to the invention is therefore greatly reduced.

An LDPC code according to the invention comprises twice as many variable nodes as constraint nodes, and each constraint node is connected to 7 variable nodes. This allows each variable node to be connected to at least 3 constraint nodes, and the presence of self-blocking configurations able to occur in the presence of variable nodes of degree 2 to be avoided.

Furthermore, the most well-known families of LDPC codes, such as for example the families disclosed by Gallager, R. (1962). Low-density parity-check codes. *IRE Transactions on information theory*, 8(1), 21-28., or MacKay, D. J., & Neal, R. M. (1996). Near Shannon limit performance of low density parity check codes. *Electronics letters*, 32(18), 1645-1646., are more often than not families in which each constraint node is connected to 6 variable nodes, and each variable node to exactly 3 constraint nodes. These codes are referred to as regular codes (each variable node is linked to the same number of constraint nodes, and vice versa). The codes referred to as regular are the codes most often used owing to their simplicity of implementation.

However, the applicant has observed experimentally that codes referred to as irregular, in which the variable nodes are not all linked to the same numbers of constraint nodes, had a minimal distance between the longer words, and hence a higher probability of error correction. This observation has also been made by some authors, for example in SHORT PROTOGRAPH-BASED LDPC CODES, Dariush Divsalar, Sam Doliner and Christopher Jones, Military Communications Conference, 2007. MILCOM 2007. IEEE, section IV.

An LDPC code comprising 128 variable nodes, 64 constraint nodes, and for which each constraint node is linked to 7 variable nodes therefore advantageously allows:
  a code of short length to be obtained;
  for each variable node to be connected to 3 constraint nodes or more. This allows both the presence of variable nodes of degree 2 to be avoided, and an irregular code to be obtained, allowing a greater distance between the code words;

This combination of features therefore allows short codes exhibiting very high decoding performances to be obtained.

An LDPC code according to the invention does not have any cycle of length 4. This avoids having very short cycles, which have a high probability of propagation of false beliefs, and thus allows the reliability of the code to be significantly increased.

An LDPC code according to the invention allows data to be transmitted over very noisy channels, with a low rate of decoding errors. It thus allows data to be transmitted over long distances, with a low transmission power and hence a low electrical consumption. An LDPC code according to the invention thus allows the lifetime of a battery of a water, gas or electricity meter transmitting frames of data via radio link for the remote reading to be extended, the number of remote reading data concentrators on a water, gas or electricity distribution network to be limited and/or the number of water, gas or electricity meters accessible to the remote reading to be increased.

The LDPC code according to the invention may for example be used for transmitting remote reading data, particularly data coming from a water or energy meter, for example a gas or electricity meter.

The use of a protograph allows a simple definition of the graph, while at the same time distributing the link lines uniformly over all the nodes. This allows a simple definition of an LDPC code family, having a limited number of short cycles. In addition, the use of a protograph allows a set of operations of the encoder to be factorized, and thus the LDPC encoder, and to a lesser extent the LDPC decoder, to be rendered less complex.

Advantageously, said Tanner bipartite graph comprises, for each link between a variable node of the protograph and a constraint node of the protograph, 16 links between a variable node of the graph and a constraint node of the graph, said 16 links being defined by a circular permutation according to an order in the range between 0 and 15.

The protographs of this type allow the Tanner graph to be defined, by the simple definition, for each link of the graph, of the order of permutation. The characterization by a protograph allows a simple and compact representation of the Tanner graph of the code.

Advantageously, each order of permutation is defined by a cell of a matrix, each constraint node being represented by a row of the matrix, each variable node being represented by a column of the matrix, each cell of the matrix, defined on a row and a column containing an order of circular permutation for a link between a constraint node of the protograph represented by the row and a variable node of the protograph represented by the column, said matrix (500*c*) being defined by the values:

$$\begin{pmatrix} 0 & 0 & 0 & 0 & & 0 & 0 & 0 \\ 1 & 11 & 4 & 13 & 0 & & 7 & 9 \\ 8 & 10 & 14 & 6 & 11 & 11 & & 15 \\ 9 & 13 & 4 & 3 & 11 & 6 & 8 & \end{pmatrix}$$

This matrix defines an LDPC code having excellent decoding properties. Its minimum length of code is 14, it does not have any cycle of length 4, and a limited number of cycles of length 6, and experimentally has excellent decoding and error correction performances.

Furthermore, a minimum distance equal to 14 between two words of code allows code words to be obtained that are as different as possible from one another. These features allow an LDPC code to be obtained that corrects as many errors as possible.

Advantageously, said Tanner bipartite graph comprises a number of cycles of length equal to 6 that is less than 640.

This allows the number of cycles to be limited to a low number for a Tanner graph comprising 128 variable nodes and 64 constraint nodes, and hence an LDPC code to be obtained in which very few false beliefs will be propagated at the decoding. This feature thus allows an LDPC code to be obtained that corrects as many errors as possible.

Advantageously, the LDPC code exhibits an error rate at the decoding of less than 50%, for a transmission with a signal-to-noise ratio of −1.17 dB.

This feature allows the error rate to be limited in cases of very low signal-to-noise ratio. The possibility of being able to transmit data with a low signal-to-noise ratio allows data to be sent via a radio transmitter over a long distance, with a low energy consumption.

Advantageously, the encoder is configured for encoding a frame of data comprising remote reading data for water, gas or electricity.

A frame according to the invention allows remotely read data encoded by a code of the invention to be transmitted. The code according to the invention allows data read remotely a long distance away to be sent with a low consumption of energy.

The invention also describes a method for defining an LDPC code, comprising: a step for defining a set of LDPC (Low-Density Parity Check) codes characterized in that they admit a control matrix represented by a Tanner bipartite graph comprising 128 variable nodes of the graph and 64 constraint nodes of the graph, said graph being such that: each of the constraint nodes of the graph is connected to 7 variable nodes of the graph; each of the cycles of the graph has a length greater than or equal to 6; a step for selection of the codes, whose minimum distance is equal to or greater than a predefined threshold for minimum distance.

The method according to the invention allows a family of LDPC codes having high performances to be defined.

Advantageously, the method also comprises a step for selection of the codes, for which the Tanner graph comprises a number of cycles of length 6 less than a predefined number of cycles.

This step allows, from amongst a large number of codes, those which have cycles of length 4 and which will exhibit poorer performances to be quickly eliminated.

Advantageously, the method also comprises a step for selection of the codes whose error rate is less than a predefined error rate, for a transmission with a predefined signal-to-noise ratio.

This step allows the codes meeting precise performance criteria to be selected in a deterministic manner.

An LDPC encoder according to the invention allows frames of data to be encoded which will able to be transmitted and decoded over a very noisy channel. This allows the frames of data to be sent via radio links, over long ranges and with a limited energy.

The invention also describes a transmitter configured for sending frames of data comprising remote reading data for water, gas or electricity, encoded by an LDPC encoder according to the invention.

By allowing the sending of data over a very noisy channel, the use of an LDPC code in a transmitter of a remote reading device enables the data to be transmitted over long distances, with a low energy by transmitted bit. This allows the lifetime of the battery of the remote reading device to be prolonged.

The invention also describes an LDPC decoder configured for decoding signals encoded by an LDPC code, characterized in that it is based on a control matrix represented by a Tanner bipartite graph composed of 128 variable nodes of the graph and 64 constraint nodes of the graph, said graph being such that: each of the constraint nodes of the graph is connected to 7 variable nodes of the graph; each of the cycles of the graph has a length greater than or equal to 6; the minimum distance of said code is equal to or greater than 14, in which said Tanner bipartite graph is a graph derived from a protograph, said protograph comprising 8 variable nodes of the protograph, each variable node of the protograph being a group of 16 variable nodes of the graph and 4 constraint nodes of the protograph, each variable node of the protograph being a group of 16 constraint nodes of the graph, in which each constraint node of the protograph is connected to 7 of said variable nodes of the protograph according to a matrix, each constraint node of the protograph being represented by a row of the matrix, each variable node of the protograph being represented by a column of the matrix, each cell of the matrix, defined on a row and a column, comprising the value 1 when the variable node of the protograph represented by the row of the cell and the constraint node of the protograph represented by the column of the cell are connected, and the value 0 in the opposite case, said matrix being defined by the values:

$$\begin{pmatrix} 1 & 1 & 1 & 1 & 0 & 1 & 1 & 1 \\ 1 & 1 & 1 & 1 & 1 & 0 & 1 & 1 \\ 1 & 1 & 1 & 1 & 1 & 1 & 0 & 1 \\ 1 & 1 & 1 & 1 & 1 & 1 & 1 & 0 \end{pmatrix}$$

The use of an LDPC code according to the invention allows the number of iterations needed for decoding the code, and thus the processing power required in the decoder, to be reduced. The decoder may be situated in a data concentrator, or a modem linked to a data concentrator. Furthermore, by enabling the transfer of remote reading data over very noisy channels, the use of an LDPC code according to the invention allows the maximum distance between a metering device and a hub to be increased, and thus the number of hubs to be reduced, and/or the number of metering devices from which data are received to be increased.

Advantageously, said Tanner bipartite graph comprises, for each link between a variable node of the protograph and a constraint node of the protograph, 16 links between a variable node of the graph and a constraint node of the graph, said 16 links being defined by a circular permutation according to an order in the range between 0 and 15.

Advantageously, each permutation order is defined by a cell of a matrix, each constraint node of the protograph being represented by a row of the matrix, each variable node of the protograph being represented by a column of the matrix, each cell of the matrix, defined on a row and a column containing a circular permutation order for a link between a constraint node of the protograph represented by the row and a variable node of the protograph represented by the column, said matrix being defined by the values:

$$\begin{pmatrix} 0 & 0 & 0 & 0 &  & 0 & 0 & 0 \\ 1 & 11 & 4 & 13 & 0 &  & 7 & 9 \\ 8 & 10 & 14 & 6 & 11 & 11 &  & 15 \\ 9 & 13 & 4 & 3 & 11 & 6 & 8 &  \end{pmatrix}$$

Advantageously, said Tanner bipartite graph comprises a number of cycles of length equal to 6 of less than 640.

Advantageously, the code has an error rate at the decoding of less than 50%, during a transmission with a signal-to-noise ratio of −1.17 dB.

Advantageously, the decoder is configured for decoding a frame of data comprising remote reading data for water, gas or electricity.

The invention also describes a receiver configured for receiving frames of data comprising remote reading data for water, gas or electricity, encoded by an LDPC encoder according to the invention, said receiver comprising a decoder according to the invention.

The receiver may be a modem comprising a radio antenna, said modem being linked to a hub.

BRIEF DESCRIPTION OF THE DRAWINGS

Other features will become apparent from reading the detailed description given by way of non-limiting example that follows, presented with regard to the appended drawings which show:

FIGS. 8a and 8b, examples of number of iterations needed for decoding a LDPC code according to the invention, respectively with bad and with good SNR.

DETAILED DESCRIPTION

In the following part of the description, the LDPC code, encoder, decoder and method according to the invention are illustrated by examples relating to remote reading, notably of data relating to the consumption of water. However, an LDPC code according to the invention is applicable to the transmission of any type of data.

Figure 1:
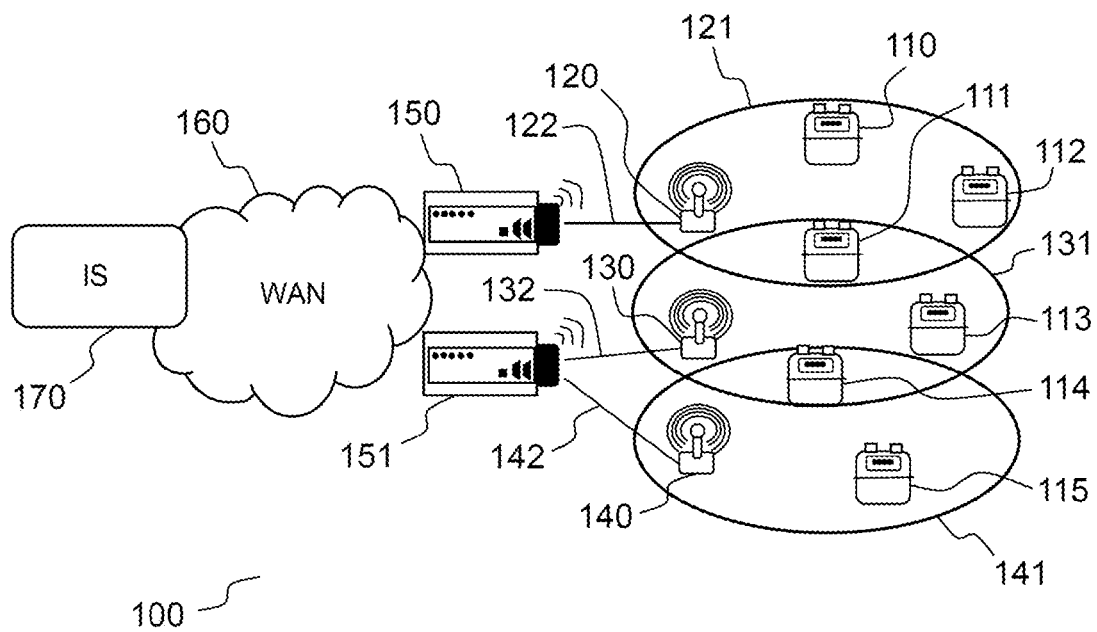
FIG. 1, an architecture of a network for acquisition and for centralization of measurements from sensors of a distribution network in one embodiment of the invention.

FIG. 1 shows an architecture of a network for acquisition and for centralization of measurements from sensors of a distribution network in one embodiment of the invention.

The architecture 100 is formed of:
A set of metering devices. 6 metering devices 110, 111, 112, 113, 114, 115 are shown in FIG. 1;
LAN (Local Area Network) modems 120, 130, 140;
Concentrators 150, 151;
A WAN network (Wide Area Network, or Network Ethernet) 160;
An Information System (IS) 170.

The metering devices 110, 111, 112, 113, 114, 115 may be water meters, but also meters for gas, electricity, or any type of consumption. The metering devices send the metering data, or remote reading data, via radio waves. The transmission of the data via radio waves allows the data to be sent from a remote location, even if the metering device is isolated or in a location that is difficult to access. Moreover, the sending of data via radio waves allows new meters to be deployed much more readily and cost effectively than if a wired link were necessary. The metering devices 110, 111, 112, 113, 114, 115 are generally powered by a battery. The use of a radio link for transmitting the data locally to a LAN modem allows the metering devices to be able to transmit their data with a low electrical consumption, hence prolonging the lifetime of the battery.

In order to transmit the remote reading data, the metering devices are equipped with an LDPC encoder configured for encoding signals using an LDPC code based on a control matrix represented by a Tanner bipartite graph comprising 128 variable nodes of the graph and 64 constraint nodes of the graph, said code being characterized in that: each of the constraint nodes of the graph is connected to 7 variable nodes of the graph; each of the cycles of the graph has a length greater than or equal to 6; the minimum distance of said code is equal to or greater than a predefined threshold for minimum distance. The various embodiments of said LDPC code are described with reference to the following figures. This encoder may be implemented in the form of hardware or software. For example, it may be present in the form of code instructions allowing a processor to be configured for decoding an LDPC code according to the invention. In another embodiment of the invention, it may take the form of an electronic calculation logic. The use of an LDPC encoder according to the invention allows the frames of remote reading data to be transmitted with a low energy, and thus the lifetime of the battery to be prolonged.

The remote reading data form, after application of the LDPC code, a frame of encoded data. In order to transmit said frames of data, the metering devices are equipped with at least one transmitter configured for transmitting frames of data comprising remote reading data for water, gas or electricity, encoded by an LDPC encoder according to the invention. The data transmitter may for example be a modem integrated into the metering device, comprising a modulator and a radio antenna. According to various embodiments of the invention, the modulation may for example be of the GMSK (for Gauss Minimum Shift Keying) or GFSK (for Gaussian Frequency Shift Keying) type. The invention may also be applied to other types of modulation, such as BPSK (for Binary Phase Shift Keying), QPSK (for Quadrature Phase Shift Keying), OQPSK (for Offset Quadrature Phase Shift Keying), etc. modulations.

The LAN modems 120, 130, 140 are configured for receiving data from the metering devices 110, 111, 112, 113, 114, 115 via radio link. Each of the LAN modems 120, 130, 140 is capable of receiving data from metering devices situated within its radio coverage area. The radio coverage areas of 3 modems 120, 130, 140 are respectively the areas 121, 131, 141. For example, the metering device 110 is situated within the radio coverage area 121: the data sent by the metering device 110 will therefore be received by the LAN modem 120. The metering device 111 is, on the other hand, situated both within the radio coverage area 121 and within the radio coverage area 131. The data sent by the metering device 111 will therefore be received both by the LAN modem 120 and the LAN modem 130. According to various embodiments of the invention, the links between the metering devices and the moderns May be unidirectional or bidirectional links. In the case of a unidirectional link, the metering device may periodically send a consumption data value. In the case of a bidirectional link, a consumption data value may be sent in response to a message from a modem 120, 130 or 140. In other embodiments of the invention, the moderns 120, 130, 140 are mobile.

By enabling the transmission over a very noisy channel, the use of an LDPC code according to the invention allows the range of the transmission of remote reading data to be increased. Thus, as a result, the radio coverage areas are enlarged. This allows both the number of hubs/modems for covering the same number of metering devices to be reduced, and/or the number of metering devices whose signals are sensed to be increased. The use of an LDPC code according to the invention thus allows the remote reading of metering devices with very little accessibility, for example metering devices on deeply buried sites.

The LAN modems 120, 130, 140 are linked to the concentrators 150, 151 via Ethernet links, respectively the links 122, 132 and 142.

The concentrators 150, 151 send the data coming from the metering devices to the IS 170 over a WAN network 160. The WAN network 160 may for example be a network 2G or 3G. The information system 170 can thus collect all of the data coming from the metering devices, and carry out the remote reading of consumptions efficiently. These data will thus be usable for calculating the consumptions of the various users. According to other embodiments of the invention, the data coming from the metering devices may also be used to improve the detection of events on a distribution network. For example, in an embodiment in which the metering devices are metering devices for a consumption on a water distribution network, the consumption data will be usable for detecting leaks in the water distribution network. The European patent applications no. 15306029.8, and no. 15306546.1, filed by the applicant, each describe a method for detecting events in a water distribution network, in which data from sensors, which can comprise data coming from remote reading, are used to detect events, for example leaks, in a water distribution network.

The architecture 100 is described only by way of non-limiting example. Those skilled in the art can imagine other architectures, notably comprising any number of metering devices, hubs, and/or LAN modems.

Figure 2:
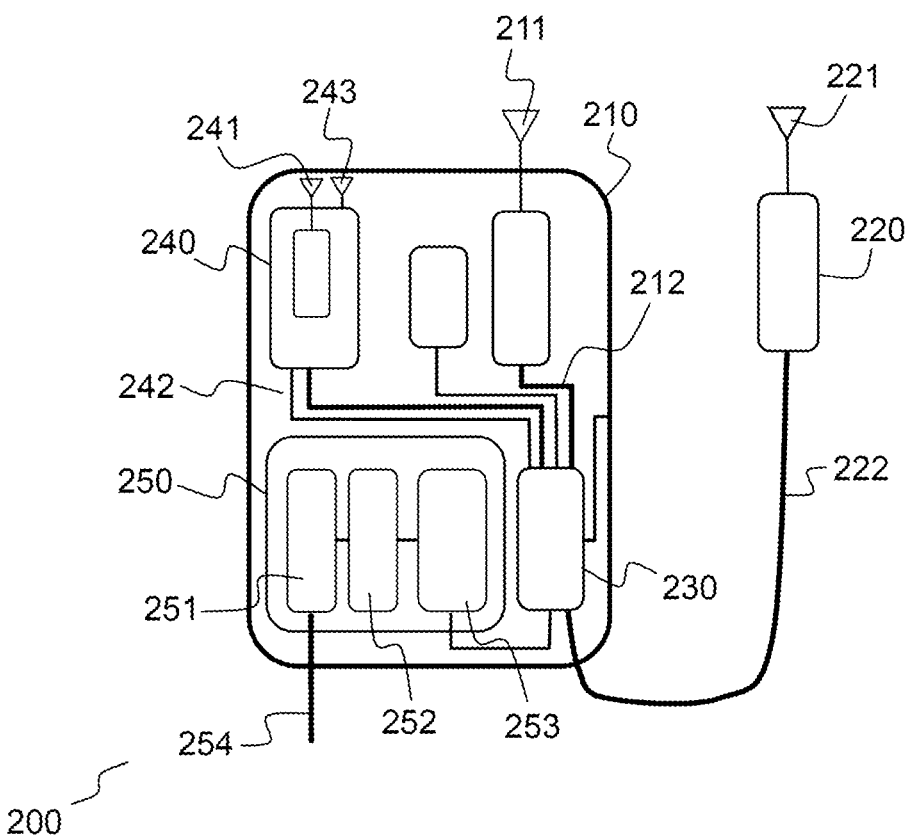
FIG. 2, a physical architecture of a data concentrator in one embodiment of the invention.

FIG. 2 shows a physical architecture of a data concentrator in one embodiment of the invention.

The concentrator 200 comprises at least one receiver, which may be a LAN modem. This could be an internal LAN modem 210 and/or an external LAN modem 220. The LAN modem may comprise an antenna 211, 221 for receiving data from the metering devices, and is connected to a patch board 230 via Ethernet link 212, 222. The Ethernet link 221, 222 may be used both for the transmission of data and the powering of the modem. In the case of an external modem, the wired Ethernet link may have a limited length, for example 100m.

In one embodiment of the invention, the radio link between the metering devices and the receiver 211, 221 uses a protocol based on the standard EN13757-4, and may for example use a reception band of +/−50 KHz around the central frequency, which may for example be 169.45 MHz. The LAN modem 210, 211 may then be configured for simultaneously filtering 6 channels of width 12.5 kHz. The LAN modem 210, 211 comprises at least one demodulator. Any type of modulation may be used in the invention. In some embodiments of the invention, the demodulator may for example be configured for demodulating each of the channels by means of one of the following demodulators:

A GFSK (for Gaussian Frequency-Shift Keying) demodulator compatible with a mode of transmission at 2400 bps (bits per second);

A GFSK demodulator compatible with the mode of transmission N/2400 bps of the standard pr-EN13757-4, A GFSK demodulator compatible with the mode N/4800 bps of the standard pr-EN13757-4, A 4GFSK demodulator compatible with the mode WM-HSPEED (6400 bps);

A GMSK demodulator of orderd ½, the GMSK modulation of order ½ proving to be particularly efficient for the transmission of LDPC codes.

The modem 210, 220 also comprises an LDPC decoder according to the invention. This decoder may be implemented in the form of hardware or software. For example, it may be present in the form of code instructions allowing a processor to be configured for decoding an LDPC code according to the invention. In another embodiment of the invention, it may take the form of an electronic calculation logic.

The presence of an LDPC decoder according to the invention enables the modem 210, 220 to decode signals transmitted over a very noisy channel. Thus, remote reading frames transmitted by a metering device situated far away or buried and/or transmitted with a low power will be able, even if certain bits have been altered during the transmission, to be correctly decoded. The radio coverage area of the modem 210, 220 will accordingly be broadened. It is then possible to decrease the number of hubs and/or to receive frames from metering devices further away or less accessible. The operational efficiency of the remote reading will accordingly be increased.

The patch board 230 is itself connected via an Ethernet link 242 to a WAN modem. The WAN modem allows the sending of data to an IS (Information system). For example, the WAN modem 240 may allow the sending of data to the IS 170 via the WAN network 160. According to various embodiments of the invention, the WAN modem 240 may be a 2G modem if the WAN network is a 2G network, a 3G modem if the WAN network is a 3G network, etc. The WAN modem is equipped with an antenna WAN 241 adapted to the type of WAN network in question. In one embodiment of the invention, the WAN modem 240 is also equipped with a GPS receiver 243.

The hub 200 is powered by a power supply block 250. The power supply block 250 comprises a circuit breaker, an over-voltage protection 252, and an AC/DC converter 253, and is powered via a mains supply outlet 254.

The hub 200 can thus receive, via the LAN modems 210, 220, the messages transmitted by the metering devices situated within the radio coverage areas of the LAN modems 210, 220, then transmit them via the WAN modem 240 to an IS, for example the IS 170. The architecture of the data concentrator 200 thus allows messages locally generated by the metering devices to be transmitted to a remote IS.

Figure 3:
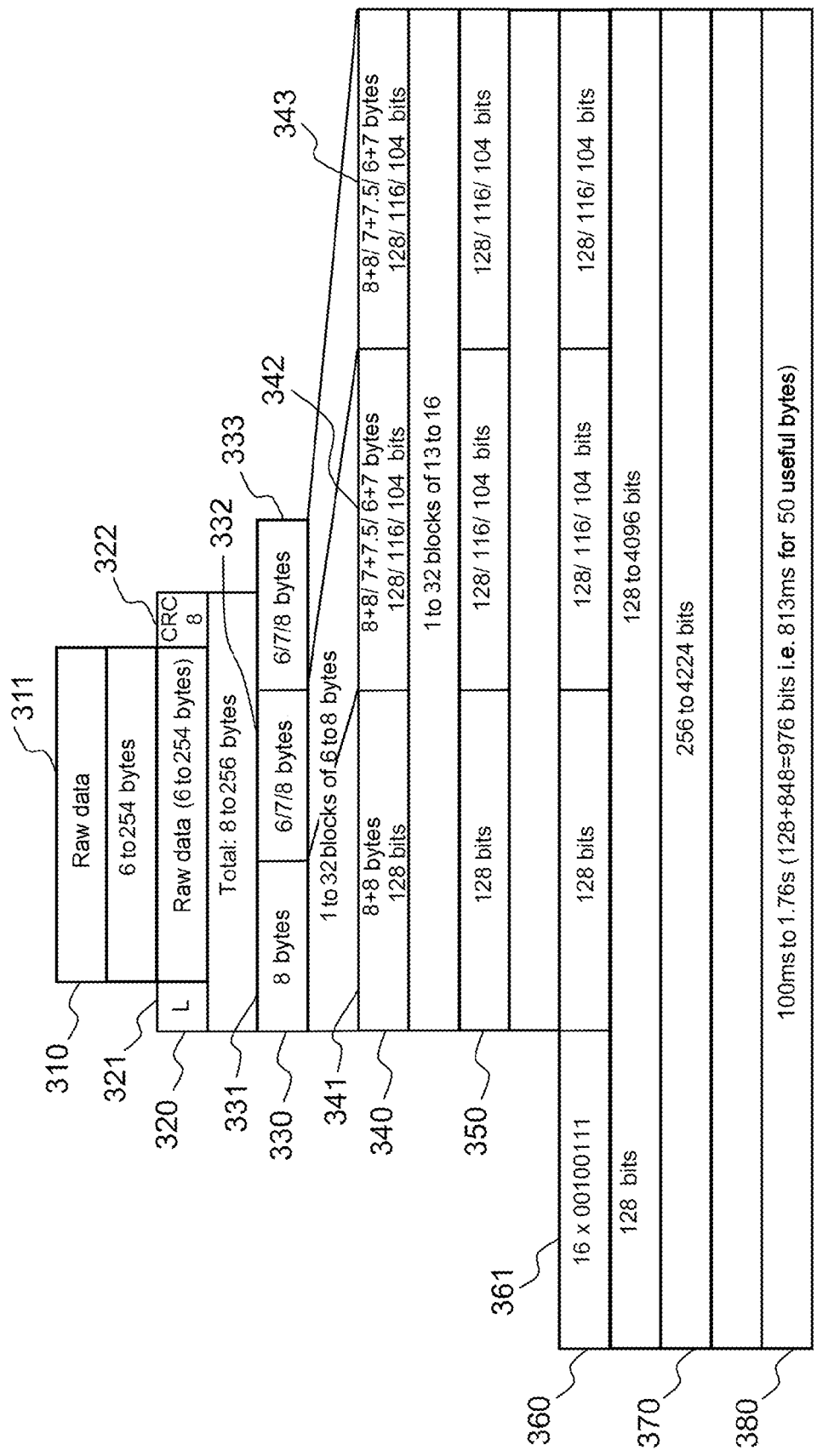
FIG. 3, a message frame for the transmission of remote reading data for a water distribution network in one embodiment of the invention.

FIG. 3 shows a message frame for the transmission of remote reading data for a water distribution network in one embodiment of the invention.

The message frame 300 will be shown according to the successive steps of its formation, starting from the raw data up to the modulated frame.

The message frame 300 according to the invention may contain any type of data. In one embodiment of the invention, it comprises remote reading data for water or for energy, for example for gas or for electricity.

A first step 310 consists in acquiring raw data 311. The raw data 311 contain for example remote reading data on water or energy consumption. The remote reading data may for example contain a daily consumption. In one embodiment, the raw data is in the range between 6 and 254 bytes.

A second step 320 consists in adding before the raw data 311 a header 321 containing a length field indicating the length of the frame, and adding after the raw data a CRC (for Cyclic Redundancy Check) byte 322. The CRC byte allows transmission errors to be detected within the raw data. In one embodiment of the invention, the length field 321 is coded over one byte, and the frame at the end of the second step 320 has a length in the range between 8 and 256 bytes.

A third step 330 consists in separating the frame into blocks 331, 332, 333. In one embodiment of the invention, the size of each block is in the range between 6 and 8 bytes, the distribution of the sizes of blocks being dependent on the size of the frame. The use of blocks of 6 to 8 bytes allows blocks to be obtained of a size sufficient to benefit from an efficient LDPC coding. The frame 300 comprises three blocks 331, 332, 333. However, in other embodiments of the invention, a frame according to the invention may comprise more or less blocks.

A fourth step 340 consists in applying an LDPC coding to each block. At the end of this step, the frame contains blocks 341, 342, 343 comprising redundancy bytes coded according to an LDPC code of the invention.

A fifth step 350 consists in applying a pseudo-random dispersion sequence to the blocks. This pseudo-random dispersion sequence allows an average density of transitions to be obtained that has little dependency on the transmitted frame. In one embodiment of the invention, the dispersion sequence is defined in the following manner:

The coded frame is defined by a sequence of N bits $\{c_0 \ldots c_{N-1}\}$;

The coded frame is transformed into a series of N symbols $\{m_0 \ldots m_{N-1}\}$ by the application of a binary exclusive OR operator with a dispersion sequence $d_k$ by the following operation: $m_k = c_k \oplus d_k$, in which the operator $\oplus$ represents the binary exclusive OR between the bits of the left-hand operand and the bits of the right-hand operand;

The sequence is defined in an iterative manner:
The twelve initial values are $\{d_0 d_1 d_2 \ldots d_{11}\} = \{101110010101\}$;
The further values are defined by: $d_k = d_{k-2} \oplus d_{k-10} \oplus d_{k-11} \oplus d_{k-12}$ A sixth step 360 consists in adding a header 361 to the frame. This predefined header 361 allows a receiver to identify the data frames of the invention.

A seventh step 370 consists in applying a differential coding to the frame.

An eighth step 380 consists in applying a modulation to the frame after differential coding. In one embodiment of the invention, the modulation of the frame is of the GMSK type.

The frame 300 is given solely by way of example, and numerous other frame formats could be developed by those skilled in the art. For example, those skilled in the art will be able to select different sizes of blocks, select a different dispersion sequence, not apply any dispersion sequence, or apply another type of modulation.

Figure 4A:
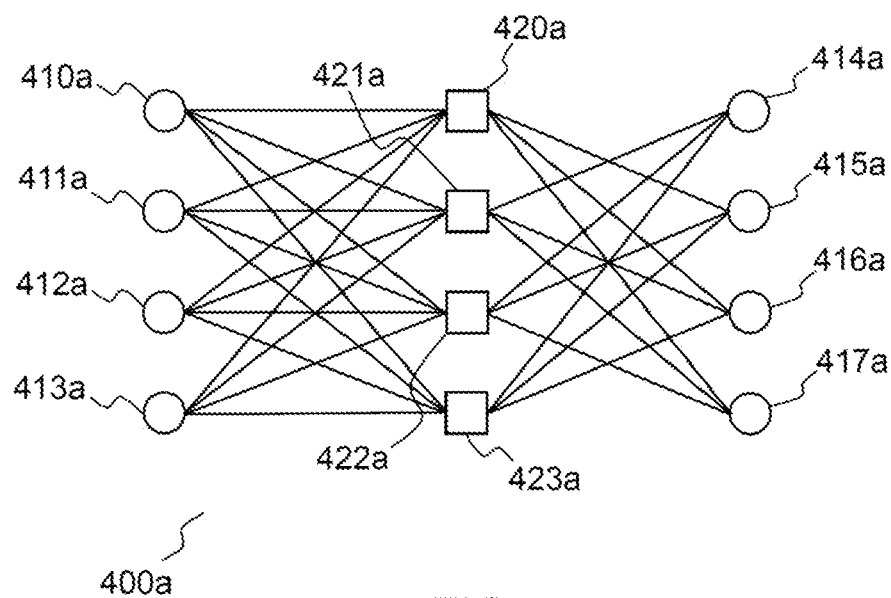
FIGS. 4a and 4b, respectively an example of a protograph and an example of a permutation allowing a Tanner bipartite graph to be obtained from a protograph in one embodiment of the invention.
Figure 4B:
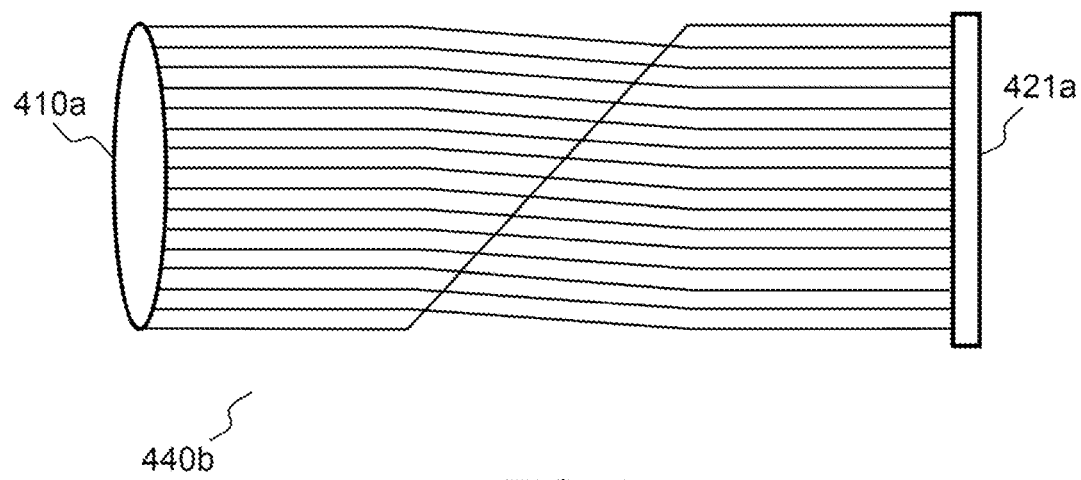

FIGS. 4a and 4b respectively show an example of protograph and an example of permutation allowing a Tanner bipartite graph to be obtained from a protograph in one embodiment of the invention.

FIG. 4a shows a protograph in one embodiment of the invention. In a set of embodiments of the invention, the bipartite graph is derived from a protograph, for example the protograph 400a shown in FIG. 4a. The protographs allow Tanner graphs to be constructed in a simple and efficient manner. The use of protographs is notably described by Thorpe, J. (2003). Low-density parity-check (LDPC) codes constructed from protographs. *IPN progress report*, 42(154), 42-154.

A LDPC code according to the invention is based on a control matrix represented by a Tanner bipartite graph comprising 128 variable nodes of the graph and 64 variable nodes of the graph. The Tanner graph is noteworthy in that each of the constraint nodes of the graph is connected to 7 variable nodes of the graph.

Moreover, said Tanner bipartite graph does not comprise any cycle of length less than 6, which allows the performance of an LDPC code according to the invention to be further enhanced. This is because the presence of cycles of short length in a Tanner graph increases the probability, at the decoding, of having an incorrect propagation of beliefs, and hence of not detecting, or propagating, an error. The absence of a cycle of length 4 in a graph according to the invention therefore allows the case of propagation of the most critical errors to be eliminated, and the performance characteristics of the LDPC code according to the invention to be enhanced.

In one embodiment of the invention, the number of cycles of length 6 of the Tanner graph is furthermore less than a predefined number of cycles. Although the presence of cycles of length 6 in the graph is less critical than the presence of cycles of length 4, it is desirable to limit their presence in order to limit the number of cycles for which a false belief may be propagated. In one embodiment of the invention, the number of cycles of length 6 of a Tanner bipartite graph is less than 640. This value allows a family of LDPC codes to be obtained that is sufficiently broad to contain performant codes, while at the same time eliminating de facto codes having a higher number of cycles of length 6, and hence having, in general, inferior performance characteristics.

In addition, the minimum distance or Hamming distance of a LDPC code according to the invention is greater than or equal to a predefined threshold. This feature allows the performance of a LDPC code according to the invention to be further enhanced, by ensuring that the code words are sufficiently different from one another. In one embodiment of the invention, the minimum distance of a LDPC code according to the invention is 14.

In a set of embodiments of the invention, a LDPC code according to the invention exhibits an error rate less than a predefined error rate, for a transmission with a predefined signal-to-noise ratio. This characteristic may be verified experimentally, by coding messages and by simulating a transmission with a given signal-to-noise ratio. In one embodiment of the invention, the error rate is less than 50%, for a transmission with a signal-to-noise ratio of −1.17 dB.

The protograph 400a comprises 8 variable nodes of the protograph 410a, 411a, 412a, 413a, 414a, 415a, 416a and 417a. The variable nodes of the protograph 410a, 411a, 412a and 413a comprise the useful bits of the message to be transmitted, whereas the variable nodes 414a, 415a, 416a, 417a of the protograph comprise the redundancy bits. Each variable node of the protograph is a group of 16 variable nodes of the graph. The protograph 400a also comprises 4 constraint nodes 420a, 421a, 422a and 423a. Each of the constraint nodes of the protograph is connected to 7 variable nodes of the protograph. The lines in FIG. 4a represent the links between the nodes. For example, the constraint node 420a is connected to the 7 variable nodes 410a, 411a, 412a, 413a, 415a, 416a and 417a.

In an equivalent manner, the protograph may be represented by a matrix, each constraint node being represented by a row of the matrix, each variable node being represented by a column of the matrix, each cell of the matrix, defined on a row and a column, comprising the value 1 when the variable node represented by the row of the cell and the constraint node represented by the column of the cell are connected, and the value 0 in the opposite case, said matrix being defined by the values. The protograph in FIG. 4a would thus be represented by the matrix:

$$\begin{pmatrix} 1 & 1 & 1 & 1 & 0 & 1 & 1 & 1 \\ 1 & 1 & 1 & 1 & 1 & 0 & 1 & 1 \\ 1 & 1 & 1 & 1 & 1 & 1 & 0 & 1 \\ 1 & 1 & 1 & 1 & 1 & 1 & 1 & 0 \end{pmatrix}$$

FIG. 4b shows an example of a circular permutation of order 1 allowing a Tanner bipartite graph to be obtained from a protograph in one embodiment of the invention.

The permutation 440b shown in FIG. 4b represents a permutation applied to the links between the group of 16 variable nodes of the graph associated with the variable node of the protograph 410a, and the group of 16 constraint nodes of the graph associated with the constraint node of the protograph 421a. Similar permutations are applicable to all the transitions shown in FIG. 4a. The variable and constraint nodes of the graph are aligned according to their order in the group of variable nodes or constraint nodes. In the example illustrated, the permutation is 1: if it is considered that each variable or constraint node of the graph has an order i in the range between 0 and 15 representing its position within the group of nodes, each variable node, of order i, is connected to the constraint node of order i+1, except for the variable node of order 15, which is connected to the variable node of order 0.

More generally, in one embodiment of the invention, when a variable node of the protograph is connected to a constraint node of the protograph, the permutation allowing the links between the variable nodes of the graph and the associated constraint nodes of the graph is defined by a single order n of permutation in the range between 0 and 15. According to the notation defined above, the variable node of the graph of order i of the group of variable nodes of the graph is connected to the constraint node of order (i+n) mod 16. In another embodiment of the invention, the variable node of the graph of order i of the group of variable nodes of the graph is connected to the constraint node of order (i−n) mod 16. In another embodiment of the invention, one of these two possibilities is used for the links with the variable nodes representative of useful bits, and the other for the links with the variable nodes representative of redundancy bits. In the following part of the description, each of the two possibilities (connect the variable node of order i to the constraint node of order (i+n) mod 16; connect the variable node of order i to the constraint node of order (i−n) mod 16) will be defined as a permutation convention, the two permutation conventions being respectively denoted "permutation convention (i+n) mod 16" and "permutation convention (i−n) mod 16)".

Figure 5A:
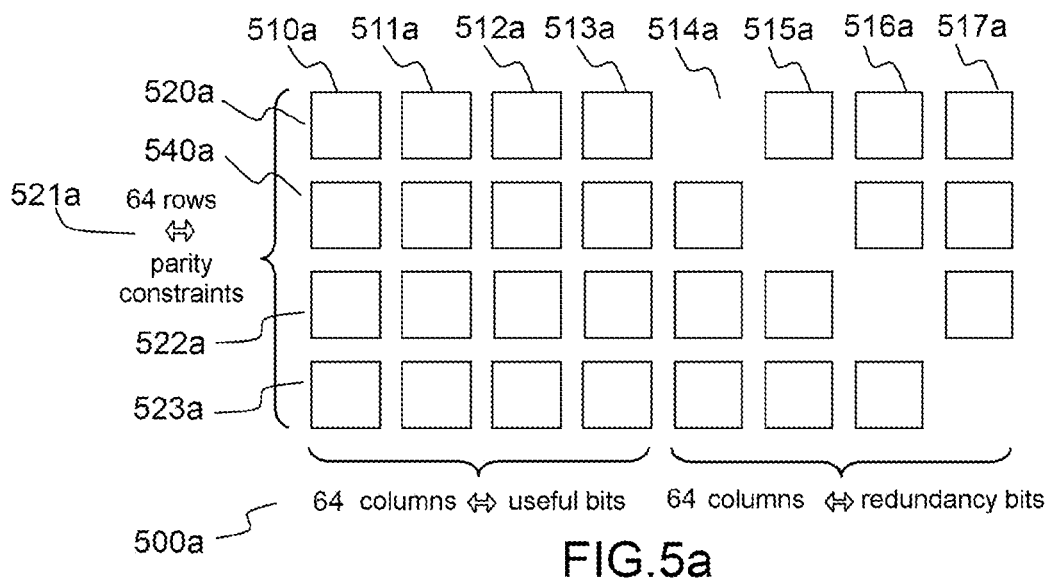
FIGS. 5a, 5b and 5c, respectively the structure of a LDPC code according to the invention, a set of constraints on a LDPC code according to the invention, allowing it to ensure that it does not comprise any cycle of length 4, and an example of a LDPC code according to the invention.
Figure 5B:
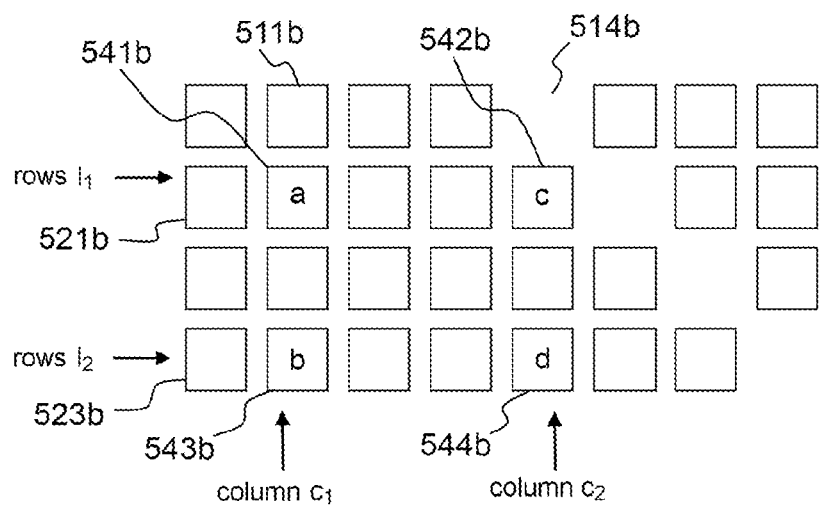
Figure 5C:
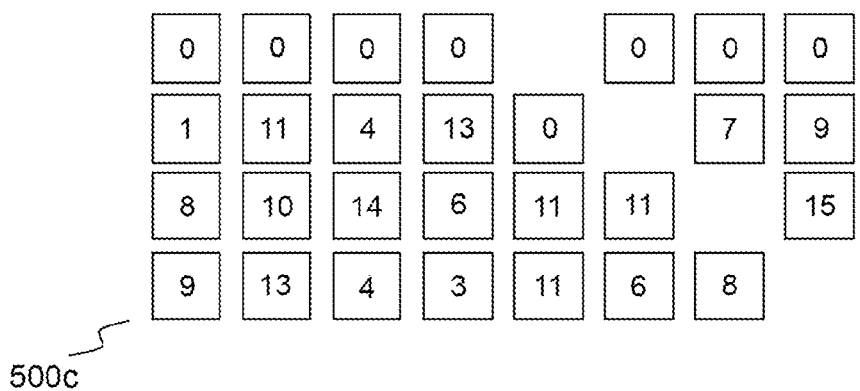

FIGS. 5a, 5b and 5c respectively show the structure of an LDPC code according to the invention, a set of constraints on an LDPC code according to the invention allowing it to be ensured that it does not comprise any cycle of length 4, and one example of LDPC code according to the invention.

FIG. 5a shows the structure of a LDPC code according to the invention.

An LDPC code according to the invention may be defined by the matrix 500a. Each of the cells of the matrix 500a stores a permutation order, such as defined for example by the permutation 400b.

The 4 lines 520a, 521a, 522a, 523a respectively represent the 4 constraint nodes of the protograph 420a, 421a, 422a, 423a. The 4 columns 510a, 511a, 512a, 513a respectively represent the 4 variable nodes of the protograph associated with useful bits 410a, 411a, 412a, 413a. The 4 columns 514a, 515a, 516a, 517a respectively represent the 4 variable nodes of the protograph associated with redundancy bits 414a, 415a, 416a, 417a. Thus, the cell 540a contains for example the permutation order of the link between the variable node of the protograph 410a (first column) and the constraint node of the protograph 421a (second row).

The structure of the matrix 500a clearly reflects the structure of the protograph 400a: each constraint node of the protograph is linked to the 4 variable nodes of the protograph representing useful bits, and to 3 variable nodes of the protograph representing redundancy bits, i.e. 7 variable nodes of the protograph altogether. Furthermore, the absence of a cell comprising a permutation order between the columns and rows 520a and 514; 521a and 515a; 522a and 516a; 523a and 517a respectively corresponds to the absences of links between the nodes 420a and 414a; 421a and 415a; 422a and 416a; 423a and 417a, respectively.

All of the permutation orders contained in the cells of the matrix 500a therefore accordingly allow the Tanner graph to be defined in a deterministic manner: the application of the permutation order of each cell to the groups of 16 variable nodes and of 16 constraint nodes of the corresponding graph allows all the links between constraint nodes and variable nodes of the graph to be generated. In one embodiment of the invention, these links are expressed in the form of a matrix of links derived from the matrix 500a, each row of the matrix 500a being split into 16, each column of the matrix 500a also being split into 16, and the links or absences of links between constraint nodes and variable nodes of the graph being respectively represented by "1s" and "0s" in the control matrix.

FIG. 5b shows a set of constraints on an LDPC code according to the invention, allowing it to be ensured that it does not comprise any cycle of length 4.

The bipartite structure of the Tanner graph leads to the two following properties: one cycle in the graph necessarily has an even length, greater than or equal to 4. Furthermore, a cycle of length 4 is only obtained if two constraint nodes of the graph are connected to the same variable node of the graph representative of a useful bit, and to the same variable node of the graph representative of a redundancy bit. In the embodiments of the invention in which the Tanner graph is obtained by a protograph such as the protograph 400a, and by permutations such as the permutation 400b, a cycle of length 4 is obtained if, for two different rows $I_1$ and $I_2$ from amongst the rows 520a, 521a, 522a, 523a, a column $c_1$ from amongst the columns 510a, 511a, 512a, 513a, and a second column $c_2$ from amongst the columns 514a, 515a, 516a and 517a, the values of the permutation orders of i $\{c_1, I_1\}$, i$\{c_1, I_2\}$, i$\{c_2, I_1\}$ and i$\{c_2, I_2\}$ respectively contained in the cells with coordinates i$\{c_1, I_1\}$, i$\{c_1, I_2\}$, i$\{c_2, I_1\}$ and i$\{c_2, I_2\}$ of the matrix are such that:

(i$\{c_1, I_1\}$−i$\{c_2, I_1\}$) mod 16=(i$\{c_1, I_2\}$−i$\{c_2, I_2\}$) mod 16, if the links with the variable nodes representative of useful bits have the same permutation convention as the variable nodes representative of redundancy bits;

(i$\{c_1, I_1\}$+i$\{c_2, I_1\}$) mod 16=(i$\{c_1, I_2\}$+i$\{c_2, I_2\}$) mod 16, if the links with the variable nodes representative of useful bits and the variable nodes representative of redundancy bits have different permutation conventions;

FIG. 500b shows one example of a detection of cycle of length 4. In this example, a detection of cycles of length 4 will be carried out on the cells 541*b*, 542*b*, 543*b* and 544*b*. The cells 541*b* and 542*b* are situated on the row 521*b*, the cells 543*b* and 544*b* on the row 523*b*, the cells 541*b* and 543*b* on the column 511*b*, and the cells 542*b* and 544*b* on the row 514*b*. The four cells therefore contain the following permutation orders:

the cell 541*b* an order a, representative of the permutation assigned to the link between the nodes 411*a* and 421*a* of the protograph 400*a*;

the cell 542*b* an order c, representative of the permutation assigned to the link between the nodes 414*a* and 421*a* of the protograph 400*a*;

the cell 543*b* an order c, representative of the permutation assigned to the link between the nodes 411*a* and 423*a* of the protograph 400*a*;

the cell 544*b* an order d, representative of the permutation assigned to the link between the nodes 414*a* and 423*a* of the protograph 400*a*.

In this example, it will be assumed that a permutation according to the convention (i+n) mod 16 is assigned to all of the links of the protograph, whether these be links with variable nodes representative of useful bits or links with variable nodes representative of redundancy bits. Those skilled in the art will readily be able to adapt these conditions, if other permutation conventions were used.

If the condition (a−c) mod 16=(b−d) mod 16 is verified, this means that a variable node of order i, within the group of 16 variable nodes of the graph associated with the variable node 411*a* of the protograph, is connected to a variable node of order (i+a−c) mod 16 in the group of 16 variable nodes of the graph associated with the variable nodes 414*b* of the protograph by means of two link lines going through one of the constraint nodes 521*b*.

However, this same variable node of order i is also connected, by two link lines going through one of the constraint nodes 523*b*, to the variable node of order (i+b−d) mod 16 in the group of 16 variable nodes of the graph associated with the variable node 414*b* of the protograph. If the condition (a−c) mod 16=(b−d) mod 16 is verified, the nodes of order (i+a−c) mod 16 and of order (i+b−d) mod 16 are therefore identical: the two nodes are connected by two separate groups of two link lines, and a cycle of length 4 is formed.

A cycle of length 4 may only be formed by two groups of link lines connecting a variable node representative of a useful bit and a variable node representative of a redundancy bit, and going through two different constraint nodes. The absence of a cycle of length 4 in a graph can thus be demonstrated, if no group of 4 orders disposed on two rows and two columns (one of the columns corresponding to a node of the protograph representative of useful bits, and the other corresponding to a node of the protograph representative of redundancy bits) verifies one of the conditions described hereinabove.

FIG. 5*c* shows one example of an LDPC code according to the invention.

The matrix 500*c* defines, by means of permutation orders according to the convention of the matrix 500*a*, a Tanner graph defining an LDPC code according to the invention. The control matrix 500*c* is represented by a Tanner graph having no cycle of length 4, 544 cycles of length 6, a minimum distance between two code words equal to 14. The LDPC code based on this control matrix exhibits a particularly high performance.

It should indeed be noted that this matrix possesses advantageous properties. The minimum distance of the code is 14, for a code of length 128. The ratio minimum distance/ length of code for this matrix is therefore 0.1094. The typical ratios minimum distance/length of code are for example disclosed by SHORT PROTOGRAPH-BASED LDPC CODES, Dariush Divsalar, Sam Doliner and Christopher Jones, Military Communications Conference, 2007. MIL-COM 2007. IEEE, section IV. A typical ratio for a regular code (3,6) is thus 0.023, whereas a typical ratio for a random code is 0.11. It is accordingly observed that the ratio minimum distance/length of code for this family is very high (close to that of a random code, and much higher than that of a conventional regular code (3,6)). This allows an LDPC code according to the invention to have a good decoding performance. However, a code according to the invention is more structured than a random code, which allows it to be much simpler to encode and decode than a random code.

Figure 6A:
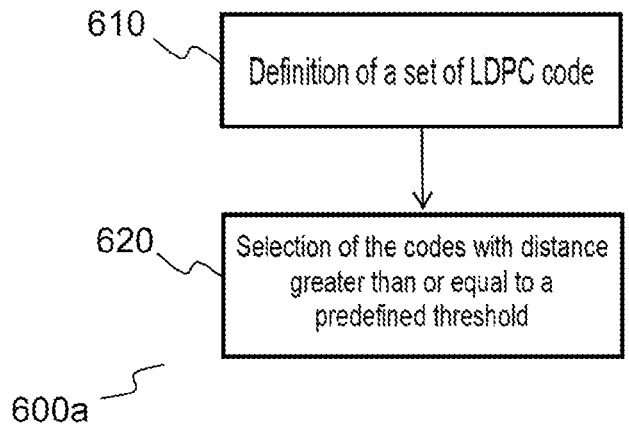
FIGS. 6a and 6b, two methods for defining a LDPC code according to the invention.
Figure 6B:
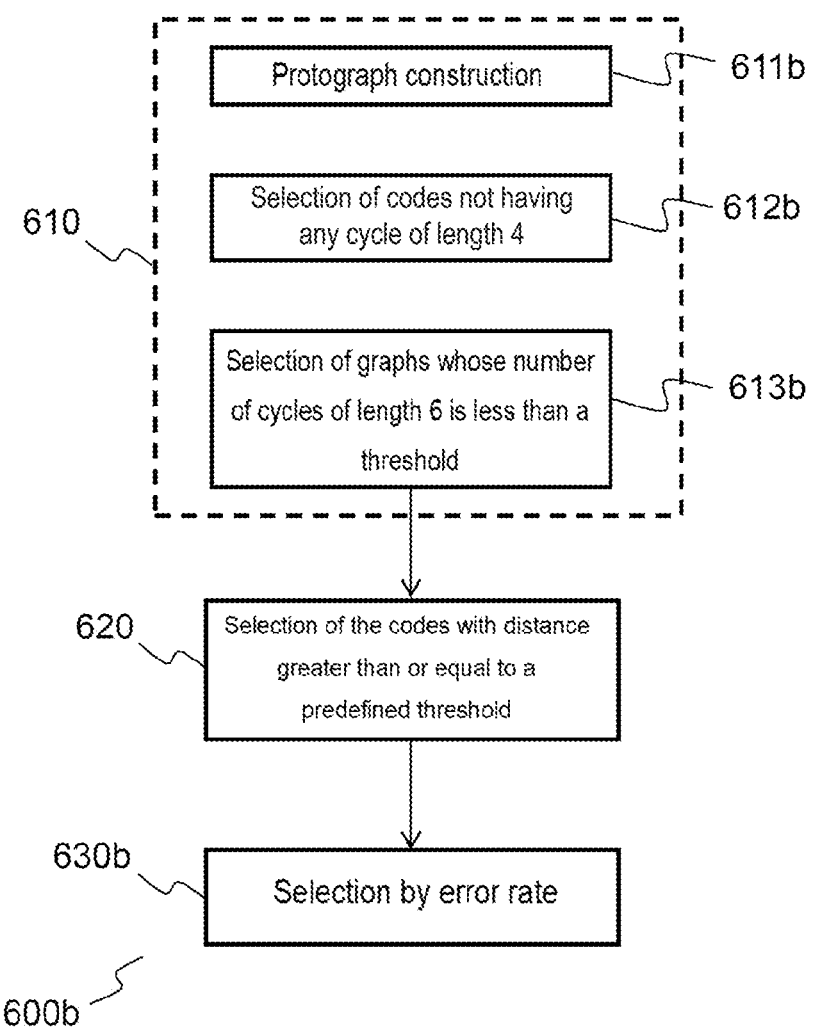

FIGS. 6*a* and 6*b* show two methods for defining a LDPC code according to the invention.

The definition of a LDPC code exhibiting good performance characteristics is a complex task. One solution referred to as a "brute force" solution consisting in testing all the possible combinations and in retaining the best code is impossible to implement in practice. This is because the combinatory analysis of all of the possible codes renders the number of codes to be tested much too large to be able to be tested in an exhaustive manner. One of the objectives of the invention is to provide a method for defining an LDPC code exhibiting a high performance, which can be implemented, including with standard processing capacities, for example by being implemented on a personal work station.

The method 600*a* is a method for defining an LDPC code in one embodiment of the invention. The method 600*a* comprises a first step 610 for defining a set of LDPC codes based on a control matrix represented by a Tanner bipartite graph comprising 128 variable nodes of the graph and 64 constraint nodes of the graph, each of said codes being characterized in that: each of the constraint nodes of the graph is connected to 7 variable nodes of the graph; each of the cycles of the graph has a length greater than or equal to 6; a second step 620 for selection of the codes, whose minimum distance is equal to or greater than a predefined threshold for minimum distance. In one set of embodiments of the invention, the predefined threshold for minimum distance is equal to 14.

The method 600*a* is advantageous in that the step 610 for defining a set of LDPC codes may be implemented by constructing Tanner graphs complying with the characteristics hereinabove. The step 610 allows a large set of LDPC codes to be created, but nevertheless considerably smaller than all of the possible LDPC codes, while at the same time ensuring that the LDPC codes of the set thus produced exhibit high performance rates. The step 620 allows a sub-set of LDPC codes to be filtered by eliminating those which, because of too small a minimum distance, will exhibit reduced performance characteristics.

The method 620*b* is a method for defining an LDPC code in a set of embodiments of the invention. The method 620*b* comprises the first step 610, and the second step 620. The first step 610 is separated into several successive sub-steps.

A first sub-step 611*b* consists in constructing one or more protographs on the model of the protograph 400*a*. In one set of embodiments of the invention, the protograph is defined by a set of permutations such as the permutation 440*b*, and a matrix of permutation orders such as the matrix 500*a*. In one embodiment of the invention, the sub-step 611*b* consists in constructing all of the protographs corresponding to all of the possible combinations of orders in a matrix such as the matrix 500a. The sub-step 611b allows a family of LDPC codes exhibiting high performance characteristics to be defined.

A second sub-step 612b consists in selecting the codes not having any cycle of length 4. This sub-step may advantageously be carried out by analyzing the orders of permutations between nodes of the protograph, for example according to the method defined with reference to FIG. 5b. This method allows the graphs having cycles of length 4 to be detected extremely simply and quickly.

A third sub-step 613b consists in selecting the graphs for which the number of cycles of length 6 is less than a predefined threshold. This third sub-step allows only the LDPC codes having few cycles of length 6 to be retained, and hence for which the probability of a false belief propagation is reduced.

In one set of embodiments of the invention, the counting of the number of cycles of length 6 of a graph is carried out in the following manner: for each link line of the graph, the link line is removed then, for example by executing a Djikstra algorithm, the shortest path between the two nodes at the ends of the link line is calculated. If the shortest path found is of length 5, then when the link line is present in the graph, a cycle of length 6 is formed. In order to avoid the same cycle being counted twice, in one embodiment of the invention, a key is assigned to each candidate cycle. An order is allocated to each node of the graph. A cycle is defined by the series of the orders of the nodes forming the cycle, the starting node being that of lowest order, and the direction of travel going from the starting node toward that of the two neighbors of the starting node having the lowest order. The duplicates can thus be eliminated, and the number of cycles of length 6 is counted in a deterministic manner.

In one set of embodiments, the method 600b comprises a third step 630b, consisting in carrying out a simulation of the error rate obtained by the LDPC coding, over a large number of blocks, when the blocks are transmitted over a channel having a given SNR ratio, and in only selecting the candidates for which the error rates are less than a predefined threshold. This step allows the codes meeting performance criteria to be selected in a deterministic manner. This step alone could, in theory, suffice for determining the best LDPC codes. However, this is the step requiring the heaviest calculations. The order of the steps of the method 600b therefore allows this third step 630b to only be applied to a sub-set of good candidates pre-selected by the preceding steps. The method 600b therefore allows LDPC codes meeting of strict performance criteria to be obtained, while at the same time requiring a sufficiently small amount of processing so as to be able to be run on ordinary computing machines.

In other embodiments of the invention, only certain steps of the method 620b are implemented. For example, the third step 630b may not be executed, and an LDPC code may be chosen directly at the end of the second step 620, the sub-step 613b may not be executed, etc. Those skilled in the art will be able to define, according to their needs, the most appropriate method for obtaining an LDPC code according to the invention.

Figure 7A:
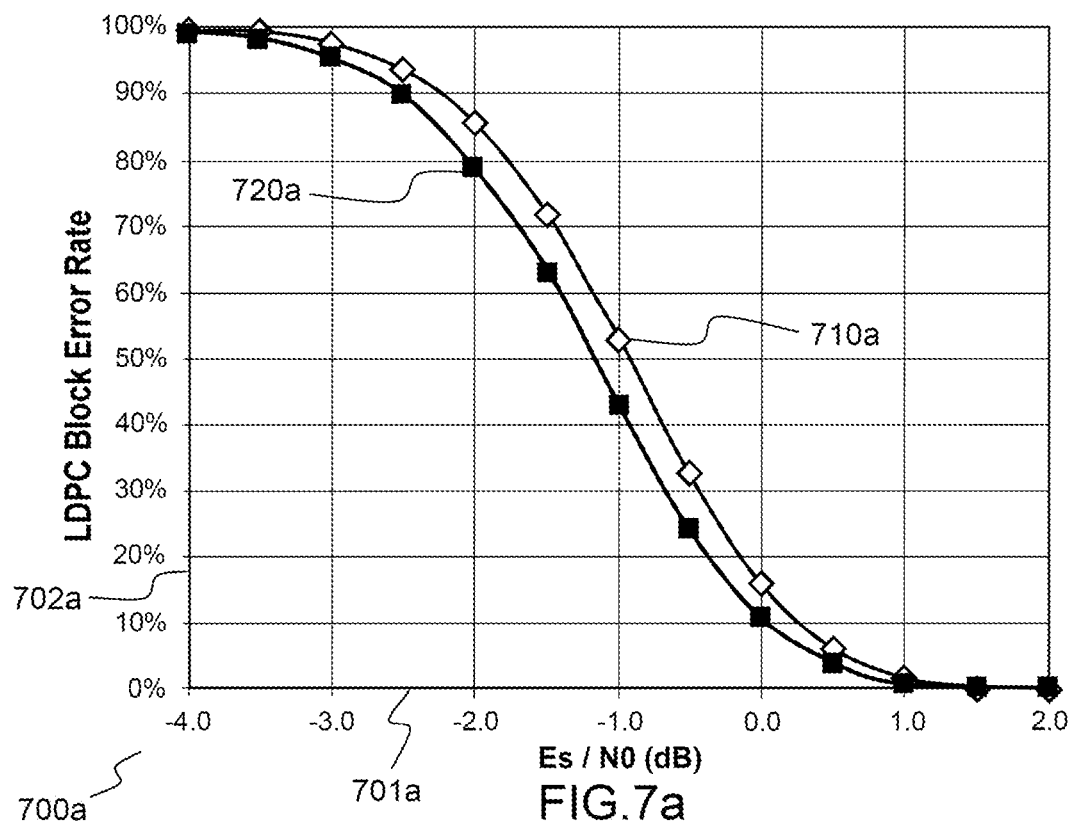
FIGS. 7a and 7b, a comparison of performances between a LDPC code according to the invention and a LDPC code of the prior art, respectively according to a linear scale and a logarithmic scale.
Figure 7B:
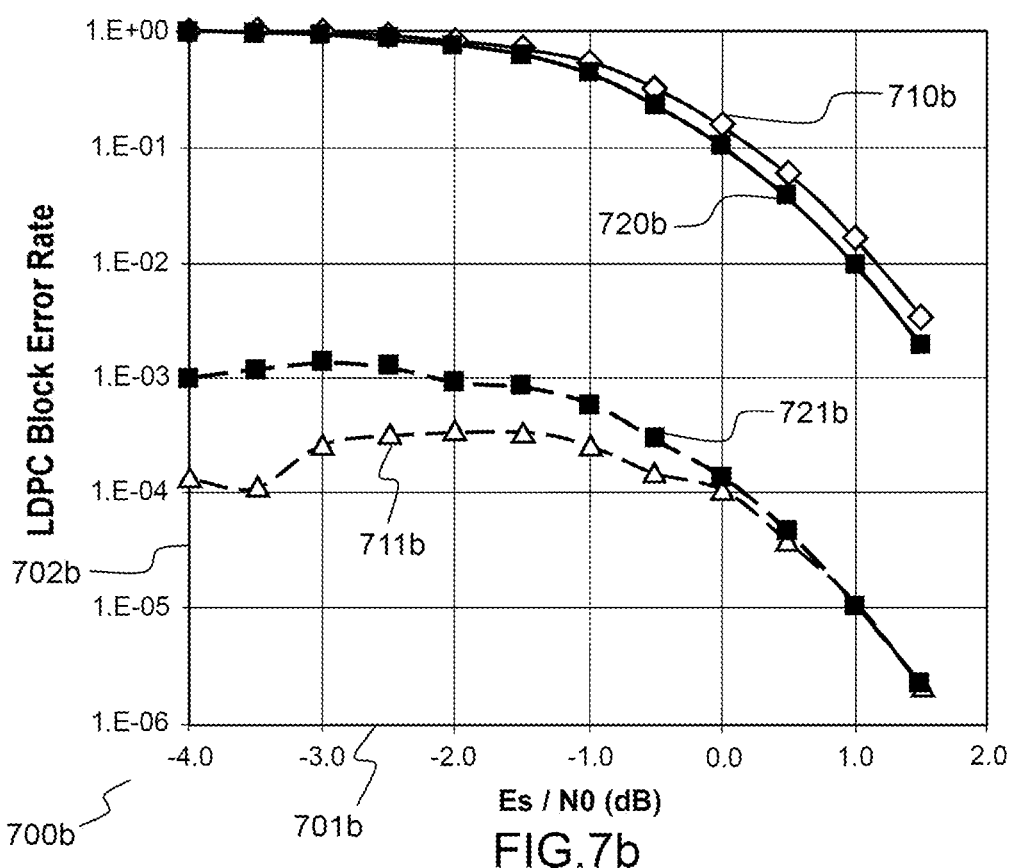

FIGS. 7a and 7b show a comparison of performances between an LDPC code according to the invention and an LDPC code of the prior art, according to a linear scale and a logarithmic scale, respectively.

The graph 700a shows a comparison of performances between an LDPC code according to the invention and an LDPC code of the prior art, according to a linear scale. The graph shows the evolution of the PER (Packet Error Rate, or fraction of blocks with an error after decoding with respect to the original code) for a given signal-to-noise ratio. This result is produced by encoding a single block according to an LDPC code, simulating a noisy channel, then simulating the decoding of the block received. A block is described as comprising an error when at least one bit in the decoded block comprises an error. The abscissa axis 701a represents the signal-to-noise ratio of the channel, in dB, and the ordinate axis 702a represents the error rates in percentage, in other words the percentage of blocks comprising at least one badly decoded bit.

The curve 710a shows the evolution of the PER (Packet Error Rate) obtained by the "Orange Book" LDPC code developed by NASA, disclosed in: *Consultative Committee for Space Data Systems Short Block Length LDPC Codes for TC Synchronization and Channel Coding Experimental Specification CCSDS* 231.1-0-1, Orange Book, April 2015 http://public.ccsds.org/publications/archive/231x1o1.pdf.

The curve 720a shows the error rates obtained by an LDPC code according to the invention, in this case the code represented by the matrix 500c.

It may be observed that the LDPC code according to the invention exhibits, for all of the signal-to-noise ratios, a better performance than the "Orange Book" code of the prior art, in other words a lower error rate on the blocks LDPC.

The graph 700b shows a comparison of performances between an LDPC code according to the invention and an LDPC code of the prior art, according to a linear scale. The abscissa axis 701b represents the signal-to-noise ratio of the channel, in dB, and the ordinate axis 702b represents the error rates, according to a logarithmic scale. The curves 710b and 720b respectively show the evolution of the error rates on the SNR obtained for a block by the "Orange Book" LDPC code, and the LDPC code according to the invention, in this case the code represented by the matrix 500c.

The curve 711b shows the evolution of the error rates not detected by the "Orange Book" code as a function of the Signal-to-Noise Ratio, and the curve 721b shows the evolution of the error rates not detected by the LDPC code according to the invention as a function of the Signal-to-Noise Ratio.

It may be observed that, although these two rates are very low at any signal-to-noise ratio, the error rates not detected by the code according to the invention is higher than the error rates not detected by the "Orange Book" code ($10^{-3}$ instead of $10^{-4}$). However, the capacity for error correction of the code according to the invention is significantly higher than that of the prior art (10% of error rate for the code according to the invention at 0 dB, versus 15% in the prior art). This feature allows the LDPC code according to the invention to be used for transmitting information over very noisy channels. This more particularly allows, in the case of remote meter reading, both the number of hubs and the energy used by the metering devices for transmitting the data to be limited, and hence the lifetime of the battery of the metering devices to be prolonged.

Figures 1, 8A:
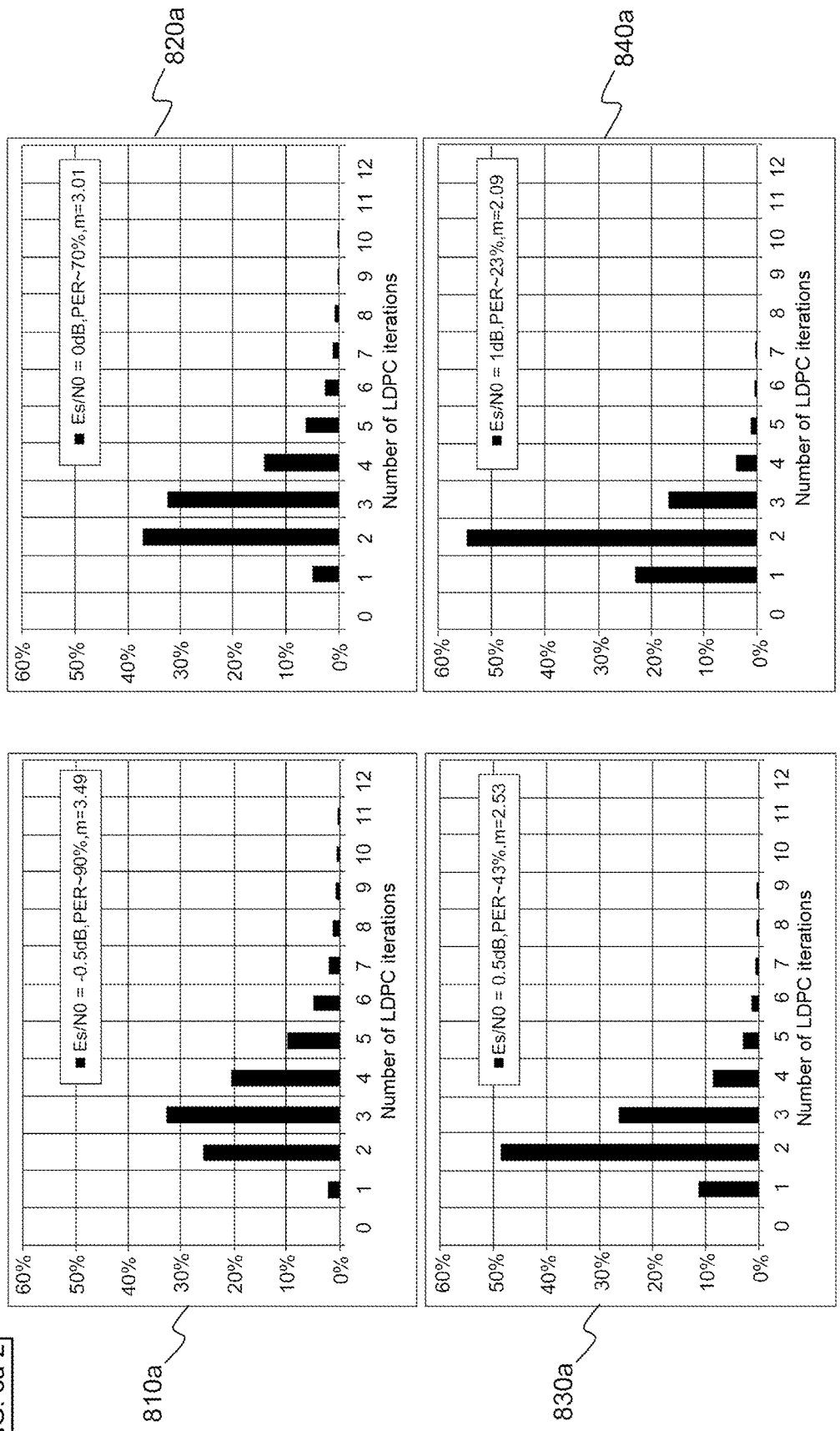

FIGS. 8a and 8b show examples of number of iterations needed for decoding a LDPC code according to the invention, respectively with a bad and with a good SNR.

FIG. 8a shows six graphs 810a, 820a, 830a, 840a, 850a and 860a each representing the distribution of the numbers of iterations required for decoding a block, for a given signal-to-noise ratio. It is known that the LDPC decoding uses several successive iterations for decoding the data. A first step consists in verifying whether any error has been transmitted. If this is the case, no decoding iteration will be used (this corresponds to the case "0 decoding iterations" on the graphs). In the opposite case, the LDPC decoding comprises successive decoding iterations, each iteration being followed by a phase for verifying that the decoded code no longer comprises errors. If the code no longer comprises errors, the decoding is halted. In the opposite case, a new decoding iteration is carried out, until the code no longer comprises any errors, or until a maximum number of decoding iterations has been reached. Since the LDPC decoding is quite a difficult operation, the limitation on the number of decoding iterations allows a significant amount of processing power to be saved within the decoder.

The histogram 810*a* shows the distribution of the number of iterations of LDPC decoding needed for decoding various blocks encoded by a LDPC code according to the invention, in this case the code defined by the matrix 500*c*, for a signal transmitted over a channel having an SNR ratio of −0.5 dB. The numbers of iterations shown on the abscissa axis represent the various numbers of possible decoding iterations, and the ordinate axis shows the percentage of blocks for which a given number of iterations is needed. Thus, for an SNR ratio of −0.5 dB, around 2% of the blocks have been decoded in one iteration, around 25% of the blocks have been decoded in two iterations, around 32% of the blocks have been decoded in 2 iterations, etc. For this SNR, a PER (for Packet Error Rate) of around 90%, and an average number of decoding iterations of 3.49 is observed. It should be noted that the results shown by FIGS. 8*a* and 8*b* relate to packets comprising 4 blocks, and that a packet is considered as having an error if there is at least one error on at least one decoded block.

In the other cases shown in FIG. 8*a*, the following results are obtained:

Histogram 820*a*: channel having an SNR ratio of 0 dB: PER of around 70%, average number of decoding iterations: 3.01;

Histogram 830*a*: channel having an SNR ratio of 0.5 dB: PER of around 43%, average number of decoding iterations: 2.53;

Histogram 840*a*: channel having an SNR ratio of 1 dB: PER of around 23%, average number of decoding iterations: 2.09;

Histogram 850*a*: channel having an SNR ratio of 1.5 dB: PER of around 11%, average number of decoding iterations: 1.74;

Histogram 860*a*: channel having an SNR ratio of 2 dB: PER of around 5%, average number of decoding iterations: 1.44.

FIG. 8*b* shows two graphs 810*b* and 820*b* each representing the distribution of the numbers of iterations needed for decoding a block, for a given signal-to-noise ratio, in cases of high signal-to-noise ratio. In these two cases, the following results are obtained:

Histogram 810*b*: channel having an SNR ratio of 5 dB: PER close to 0%, average number of decoding iterations: 0.58;

Histogram 820*b*: channel having an SNR ratio of 5.5 dB: PER close to 0%, average number of decoding iterations: 0.43.

The experimental results presented in FIGS. 8*a* and 8*b* show that it is possible, even for signals transmitted over a channel having a low SNR ratio, to bound the number of decoding iterations, without decreasing, or while only marginally decreasing, the efficiency of the LDPC code. For example, it would be possible, in view of the results hereinabove, to bound the number of decoding iterations to 12 without loss of efficiency of the LDPC code, or to bound it to 8 or 10 decoding iterations, while only marginally decreasing the latter. An LDPC code according to the invention therefore clearly allows the number of decoding iterations of the LDPC code to be limited, which in turn allows significant gains in speed of execution and/or processing power within the LDPC decoder to be effected.

The examples hereinabove demonstrate the capacity of an LDPC code according to the invention to enable an efficient error correction during the transmission of data, while at the same time limiting the energy consumption per useful bit transmitted, and while also limiting the decoding complexity. They are however only given by way of example and in no case do they limit the scope of the invention, as defined in the claims hereinbelow.

The invention claimed is:

1. A system comprising:
   an LDPC (Low-Density Parity Check) encoder configured for encoding a frame of data using an LDPC code wherein it is based on a control matrix represented by a Tanner bipartite graph composed of 128 variable nodes of the graph and 64 constraint nodes of the graph, said graph being such that:
   each of the constraint nodes of the graph is connected to 7 variable nodes of the graph;
   each of the cycles of the graph has a length greater than or equal to 6;
   the minimum distance of said code is equal to 14; and
   in which said Tanner bipartite graph is a graph derived from a protograph, said protograph comprising 8 variable nodes of the protograph, each variable node of the protograph being a group of 16 variable nodes of the graph and 4 constraint nodes of the protograph, each constraint node of the protograph being a group of 16 constraint nodes of the graph, in which each constraint node of the protograph is connected to 7 of said variable nodes of the protograph according to a matrix, each constraint node of the protograph being represented by a row of the matrix, each variable node of the protograph being represented by a column of the matrix, each cell of the matrix, defined on a row and a column, comprising the value 1 when the variable node of the protograph represented by the row of the cell and the constraint node of the protograph represented by the column of the cell are connected, and the value 0 in the opposite case, said matrix being defined by the values:

$$\begin{pmatrix} 1 & 1 & 1 & 0 & 1 & 1 & 1 \\ 1 & 1 & 1 & 1 & 0 & 1 & 1 \\ 1 & 1 & 1 & 1 & 1 & 0 & 1 \\ 1 & 1 & 1 & 1 & 1 & 1 & 0 \end{pmatrix};$$

and
   a transmitter configured to send said frame of data.

2. The system as claimed in claim 1, in which said Tanner bipartite graph comprises, for each link between a variable node of the protograph and a constraint node of the protograph, 16 links between a variable node of the graph and a constraint node of the graph, said 16 links being defined by a circular permutation according to an order in the range between 0 and 15.

3. The system as claimed in claim 2, in which each permutation order is defined by a cell of a matrix, each constraint node of the protograph being represented by a row of the matrix, each variable node of the protograph being represented by a column of the matrix, each cell of the matrix, defined on a row and a column containing an order of circular permutation for a link between a constraint node of the protograph represented by the row and a variable node of the protograph represented by the column, said matrix being defined by the values:

$$\begin{pmatrix} 0 & 0 & 0 & 0 & & 0 & 0 & 0 \\ 1 & 11 & 4 & 13 & 0 & & 7 & 9 \\ 8 & 10 & 14 & 6 & 11 & 11 & & 15 \\ 9 & 13 & 4 & 3 & 11 & 6 & 8 & \end{pmatrix}.$$

4. The system as claimed in claim 1, wherein said Tanner bipartite graph comprises a number of cycles of length equal to 6 of less than 640.

5. The system as claimed in claim 1, wherein the code has an error rate at the decoding of less than 50%, for a transmission with a signal-to-noise ratio of −1.17 dB.

6. The system as claimed in claim 1, configured for encoding a frame of data comprising remote reading data for water, gas or electricity.

7. The system of claim 1, said system being a metering device wherein said frame of data comprises reading data for water, gas or electricity.

8. A system comprising:
a receiver configured to receive a frame of data encoded by an LDPC code; and
an LDPC decoder configured for decoding said data frame, wherein the LDPC code is based on a control matrix represented by a Tanner bipartite graph composed of 128 variable nodes of the graph and 64 constraint nodes of the graph, said graph being such that:
each of the constraint nodes of the graph is connected to 7 variable nodes of the graph;
each of the cycles of the graph has a length greater than or equal to 6;
the minimum distance of said code is equal to 14; and
in which said Tanner bipartite graph is a graph derived from a protograph, said protograph comprising 8 variable nodes of the protograph, each variable node of the protograph being a group of 16 variable nodes of the graph and 4 constraint nodes of the protograph, each constraint node of the protograph being a group of 16 constraint nodes of the graph, in which each constraint node of the protograph is connected to 7 of said variable nodes of the protograph according to a matrix, each constraint node of the protograph being represented by a row of the matrix, each variable node of the protograph being represented by a column of the matrix, each cell of the matrix, defined on a row and a column, comprising the value 1 when the variable node of the protograph represented by the row of the cell and the constraint node of the protograph represented by the column of the cell are connected, and the value 0 in the opposite case, said matrix being defined by the values:

$$\begin{pmatrix} 1 & 1 & 1 & 1 & 0 & 1 & 1 & 1 \\ 1 & 1 & 1 & 1 & 1 & 0 & 1 & 1 \\ 1 & 1 & 1 & 1 & 1 & 1 & 0 & 1 \\ 1 & 1 & 1 & 1 & 1 & 1 & 1 & 0 \end{pmatrix}.$$

9. The system as claimed in claim 8, in which said Tanner bipartite graph comprises, for each link between a variable node of the protograph and a constraint node of the protograph, 16 links between a variable node of the graph and a constraint node of the graph, said 16 links being defined by a circular permutation according to an order in the range between 0 and 15.

10. The system as claimed in claim 9, in which each permutation order is defined by a cell of a matrix, each constraint node being represented by a row of the matrix, each variable node being represented by a column of the matrix, each cell of the matrix, defined on a row and a column containing an order of circular permutation for a link between a constraint node of the protograph represented by the row and a variable node of the protograph represented by the column, said matrix being defined by the values:

$$\begin{pmatrix} 0 & 0 & 0 & 0 & & 0 & 0 & 0 \\ 1 & 11 & 4 & 13 & 0 & & 7 & 9 \\ 8 & 10 & 14 & 6 & 11 & 11 & & 15 \\ 9 & 13 & 4 & 3 & 11 & 6 & 8 & \end{pmatrix}.$$

11. The system as claimed in claim 8, wherein said Tanner bipartite graph comprises a number of cycles of length equal to 6 of less than 640.

12. The system as claimed in claim 8, wherein the code has an error rate at the decoding of less than 50%, for a transmission with a signal-to-noise ratio of −1.17 dB.

13. The system as claimed in claim 8, configured for decoding a frame of data comprising remote reading data for water, gas or electricity.

14. The system of claim 8, said system being a data concentrator, said data frame comprising remote reading data for water, gas or electricity, sent by a system according to claim 1.

* * * * *